(12) United States Patent
Chan et al.

(10) Patent No.: US 8,367,446 B2
(45) Date of Patent: Feb. 5, 2013

(54) METHOD FOR PREPARING PATTERNED SUBSTRATE BY USING NANO- OR MICRO-PARTICLES

(75) Inventors: Chia-Hua Chan, Keelung (TW); Chia-Hung Hou, Kaohsiung (TW); Tsing-Jen Chen, Daliao Township, Kaohsiung County (TW); Chii-Chang Chen, Pingzhen (TW)

(73) Assignee: National Central University, Jhongli, Taoyuan County (TW)

( * ) Notice: Subject to any disclaimer, the term of this patent is extended or adjusted under 35 U.S.C. 154(b) by 339 days.

(21) Appl. No.: 12/782,370

(22) Filed: May 18, 2010

(65) Prior Publication Data

US 2011/0111598 A1  May 12, 2011

(30) Foreign Application Priority Data

Nov. 9, 2009  (TW) ............................... 98137893 A

(51) Int. Cl.
*H01L 21/00* (2006.01)

(52) U.S. Cl. .................. 438/42; 438/964; 257/E21.232

(58) Field of Classification Search .................. 438/42, 438/43, 665, 950, 962, 964
See application file for complete search history.

(56) References Cited

U.S. PATENT DOCUMENTS

| 4,664,748 A * | 5/1987 | Ueno et al. ...................... 216/51 |
| 7,258,966 B2 * | 8/2007 | Chao et al. .................... 430/320 |

* cited by examiner

*Primary Examiner* — Chandra Chaudhari
(74) *Attorney, Agent, or Firm* — Muncy, Geissler, Olds & Lowe, PLLC

(57) ABSTRACT

A method for preparing patterned substrate by using nano- or micro-particles is disclosed, which comprises the following steps: (A) providing a substrate with a photoresist layer formed thereon; (B) coating a surface of the photoresist layer with plural nano- or micro-particles, to form a particle layer; (C) exposing and developing the photoresist layer to obtain a patterned photoresist layer; and (D) removing the particle layer. In addition, after the particle layer is removed, the method of the present invention further comprises: (E1) using the patterned photoresist layer as an etching template to etch the substrate; and (E2) removing the patterned photoresist layer to obtain a patterned substrate with plural cavities formed thereon.

31 Claims, 3 Drawing Sheets

METHOD FOR PREPARING PATTERNED SUBSTRATE BY USING NANO- OR MICRO- PARTICLES

BACKGROUND OF THE INVENTION

1. Field of the Invention

The present invention relates to a method for preparing a patterned substrate by using nano- or micro-particles and, more particularly, to a method for preparing a substrate for a light emitting diode or solar cell.

2. Description of Related Art

Energy insufficiency of the earth has drawn the attention of the researchers to develop more energy sources or to develop some devices for reducing the energy consumption of various electronic devices. Light emitting diodes (LEDs) are advantageous in having high illuminance, low energy consumption, long lifespan, and compact volume, and therefore can be eco-friendly used in various electronic devices.

Recently, in order to enhance a better illuminant efficiency of the LEDs, surface roughening treatments are applied to the manufacture of LEDs to increase light efficiency. During the formation of an epitaxial layer, the supply of different gases or performing of an additional etching process provided after the formation of the layer may improve the roughness of the surface of the epitaxial layer; the surface roughness can improve the light extraction efficiency. On the other hand, by using dry etching technique, the roughness of a sapphire-based substrate can also be increased, whereas the illuminant efficiency of the LEDs may be increased to about 70%.

Solar energy is an infinite energy source that does not create any additional harmful pollution. However, with its high costs and insufficient photoelectric conversion efficiency, solar cells are still not widely used in the daily life. Hence, it has been especially difficult for the researchers to successfully develop a solar cell with high photoelectric conversion efficiency and low manufacturing cost to increase the economic implementation of the solar cell.

Currently, it has been reported that by the incorporating of an antireflective layer, the light transmittance and the photoelectric conversion efficiency of the solar cell may be increased, whereas the reflectivity of the sunlight decreased when the substrate roughening process was applied to the silicon substrate (to pattern the silicon substrate) by a plasma etching method.

Though many methods such as wet and dry etching methods have been developed for surface-roughening of the LED devices or solar cell devices, they are still unfavorable due to their disadvantages such as high manufacturing cost and low alignment precision. Therefore, it is desirable to provide an improved patterning method to approach the roughening function and enable the processing cost to be lowered, and therefore increase the economic implementation of the solar cell.

SUMMARY OF THE INVENTION

The object of the present invention is to provide a method for preparing a patterned substrate by using nano- or micro-particles, which enables the patterned substrates for LEDs or solar cells to be manufactured with low cost.

To achieve the object, the method for preparing a patterned substrate by using nano- or micro-particles of the present invention comprises the following steps: (A) providing a substrate with a photoresist layer formed thereon; (B) coating on the surface of the photoresist layer with plural nano- or micro-particles, to form a particle layer; (C) exposing and developing the photoresist layer to obtain a patterned photoresist layer; and (D) removing the particle layer.

According to the method of the present invention, nano- or micro-particles can be arranged uniformly on the surface of the photoresist to serve as the mask of the photolithography process, and therefore the patterning process can be performed without an expensive photomask, and the problems which occurred during the prior art alignment process can be eliminated.

After step (D), the method of the present invention may further comprise steps: (E1) using the patterned photoresist layer as an etching template to etch the substrate; and (E2) removing the patterned photoresist layer to reveal a patterned substrate with plural cavities formed thereon. Besides, after step (E2), the method of the present invention may selectively further comprise a step (E3): filling each of the plural cavities with nano- or micro-particles.

In another embodiment of the present invention, after step (D), the method of the present invention may further comprise steps: (F1) forming a metal layer on the patterned photoresist layer; (F2) removing the patterned photoresist layer; (F3) using the metal layer as an etching template and etching the substrate; and (F4) removing the metal layer to obtain a patterned substrate having a plurality of rods.

Therefore, according to the present invention, after the photoresist layer has been patterned, the patterned photoresist layer can serve as an etching template to pattern the substrate; or the deposited metal layer formed on the photoresist layer may serve as the etching template to pattern the substrate. Alternatively, after the patterning of the substrate, the cavities of the substrate can be filled with those nano- or micro-particles to form a novel patterned substrate.

According to the method of the present invention, the substrate can be etched by a dry etching method or a wet etching method.

According to the method for preparing a patterned substrate by using nano- or micro-particles of the present invention, the photoresist layer can be a positive photoresist or a negative photoresist. When a positive photoresist is used, the photoresist layer has plural holes in the step (C); and when a negative photoresist is used, the photoresist layer has plural rods.

According to the method for preparing a patterned substrate by using nano- or micro-particles of the present invention, in the step (B), the plural nano- or micro-particles can be coated on the surface of the photoresist layer by a dip coating method, a spin coating method, a spray coating method, or a natural drying method.

According to the method for preparing a patterned substrate by using nano- or micro-particles of the present invention, in the step (F1), the metal layer can be made of a material to serve as an etching template, and the metal layer is preferably made of: silicon, titanium, platinum, zirconium, gold, silver, iron, aluminum, copper, nickel, and the combination thereof.

Also, the present invention provides a patterned substrate with a nano- or micro-level rugged structure, which comprises: a substrate; and a rugged structure locating on the surface of the substrate, wherein the rugged structure has plural cavities and/or rods.

Also, the present invention provides a novel patterned substrate with a nano- or micro-level rugged structure, which comprises: a substrate; a rugged structure locating on the surface of the substrate, wherein the rugged structure has plural cavities; and plural nano- or micro-particles, wherein each of the cavities of the patterned substrate is filled with a nano- or micro-particle.

According to the method for preparing a patterned substrate by using nano- or micro-particles of the present invention and the substrate made by the same, the plural nano- or micro-particles may be made of material selected from the group consisted of: styrene, styrene derivatives, acrylic acid, acrylic acid derivatives, maleic acid, maleic acid derivatives, and the combination thereof. Also, the plural nano- or micro-particles may be made of material selected from the group consisted of: carbon-silicon, carbon-titanium, carbon-zirconium, carbon-aluminum, and the combination thereof. Besides, the plural nano- or micro-particles may be made of material selected from the group consisted of: nitrogen, silicon, titanium, zirconium, gold, silver, iron, aluminum, copper, nickel, and the combination thereof. Preferably, the plural nano- or micro-particles are made of material selected from the group consisted of silica, polystyrene, poly(methylmethacrylate) (PMMA), and the combination thereof.

According to the method for preparing a patterned substrate by using nano- or micro-particles of the present invention and the substrate made by the same, the particle diameters of the plural nano- or micro-particles may be the same with or different from each other. Preferably, the particle diameters of the plural nano- or micro-particles are the same with each other.

The sizes of the nano- or micro-particles can be easily controlled by adjusting the reaction conditions such as temperature, concentration, pH value, the kinds of the added solution, and reaction time during the fabrication of the nano- or micro-particles. According to the method for preparing patterned substrate by using nano- or micro-particles of the present invention and the substrate made by the same, the particle diameters of the plural nano- or micro-particles may be ranged from 90 nm to 5 mm.

According to the method for preparing a patterned substrate by using nano- or micro-particles of the present invention and the substrate made by the same, the substrate can be made of silicon, aluminum and compounds thereof, gallium and compounds thereof, glass, transparent conductive glass, plastics, metal, metal oxides, metal compounds, or sapphire. When the substrate is made of sapphire, the substrate of the present invention can be used for LEDs; or when the substrate is made of silicon, transparent conductive glass, plastics, metal, metal oxides, metal compounds, the substrate of the present invention can be used for solar cells.

Since those expensive photomasks used in the prior arts are eliminated in the method for preparing a patterned substrate by using nano- or micro-particles of the present invention, the manufacturing cost can be lowered and the process time can be shortened. Hence, the manufacturing costs of the LEDs and solar cells can be lowered due to the lowering of the manufacturing cost and the simplifying of the manufacturing process of the patterned sapphire substrate or the patterned solar cell substrate made by the present invention.

Other objects, advantages, and novel features of the invention will become more apparent from the following detailed description when taken in conjunction with the accompanying drawings.

DETAILED DESCRIPTION OF THE PREFERRED EMBODIMENT

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

Example 1

Reference with FIGS. 1A to 1E, a schematic process flow chart for manufacturing a patterned substrate by using nano- or micro-particles of the present example is shown.

Figure 1A:
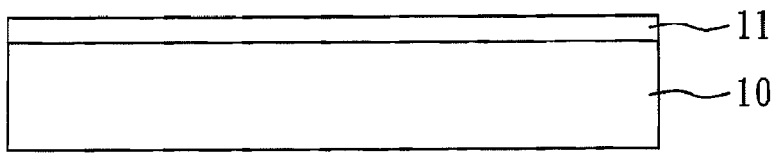
FIGS. 1A to 1E are schematic process flow charts for manufacturing a patterned substrate by using nano- or micro-particles of the example 1 of the present invention.

First, a substrate 10 is provided having a photoresist layer 11 formed thereon, as shown in FIG. 1A. Herein, the substrate 10 is a silicon substrate, and the photoresist layer 11 is a positive photoresist layer.

Figure 1B:
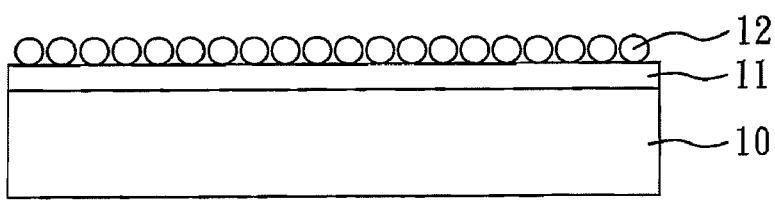

Subsequently, plural nano- or micro-particles 12 are coated on the surface of the photoresist layer 11 to form a nano- or micro-particles layer as shown in FIG. 1B. Herein, the nano- or micro-particles 12 are made of polystyrene and have the same diameter of about 1500 nm.

Figure 1C:
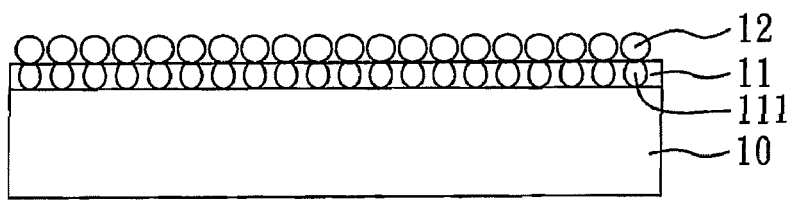

Then, exposing and developing steps are applied to pattern the photoresist layer 11 while the plural nano- or micro-particles 12 are used as lenses for light focusing, as shown in FIG. 1C. In the present example, the photoresist layer 11 is made of a positive photoresist and, after light exposing, plural holes 111 corresponding to the plural nano- or micro-particles 12 are formed in the photoresist layer 11.

Figure 1D:
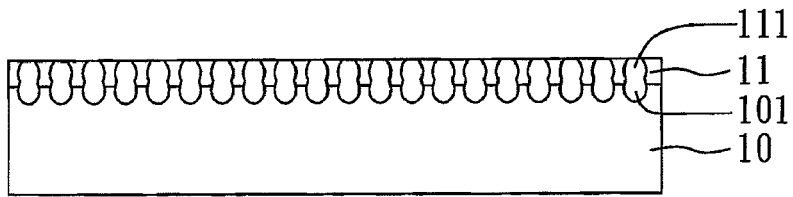

After removing the plural nano- or micro-particles 12, a substrate 10 having a patterned photoresist layer 11 formed thereon is obtained, as shown in FIG. 1D.

Then, the patterned photoresist layer 11 is used as an etching template and the substrate 10 is etched with the dry or wet etching method to form cavities 101 in the substrate 10, whereas the position of the formed cavities 101 locate corresponding to the position of the holes 111 of the patterned photoresist layer 11, as shown in FIG. 1D.

Figure 1E:
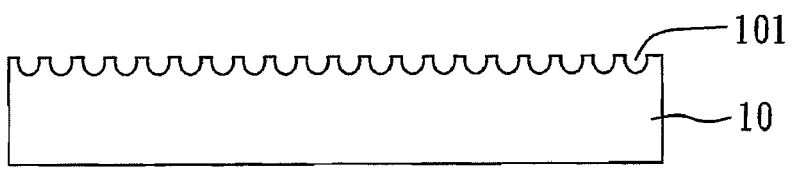

After removing the photoresist layer 11, a patterned substrate 10 is obtained, in which plural cavities 101 are formed therein, as shown in FIG. 1E. Therefore, the patterned substrate with a nano- or micro-level rugged structure of the present example is provided, which comprises: a substrate 10; and a rugged structure locating on the surface of the substrate 10, wherein the rugged structure has plural cavities 101, as shown in FIG. 1E.

Example 2

Figure 1F:
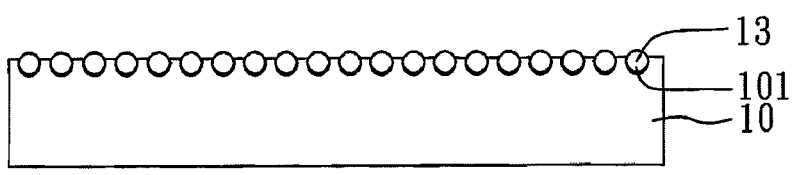
FIG. 1F is a patterned substrate provided by using nano- or micro-particles of the example 2 of the present invention.

Reference with FIG. 1F, a patterned substrate provided by using nano- or micro-particles of the present example is shown.

By using the same process steps as shown in FIGS. 1A to 1E, the substrate 10 is patterned to form plural cavities 101 therein.

Then, each of the cavities 101 of the patterned substrate 10 is filled with a nano- or micro-particle 13, in which the nano- or micro-particle 13 herein is made of silica, as shown in FIG. 1F.

Consequently, as shown in FIG. 1F, a novel patterned substrate with a nano- or micro-level rugged structure of the present example is provided, which comprises: a substrate 10; a rugged structure locating on the surface of the substrate 10, wherein the rugged structure has plural cavities 101; and plural nano- or micro-particles 13 respectively received in the cavities 101 of the patterned substrate 10.

Example 3

Reference with FIGS. 2A to 2E, a schematic process flow chart for manufacturing a patterned substrate by using nano- or micro-particles of the present example is shown.

Figure 2A:
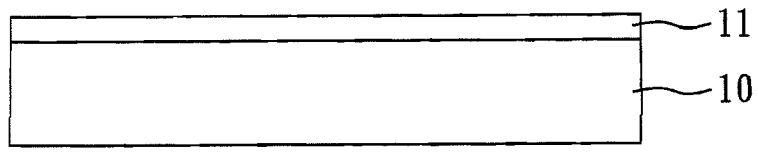
FIGS. 2A to 2E are schematic process flow charts for manufacturing a patterned substrate by using nano- or micro-particles of the example 3 of the present invention.

First, a substrate 10 is provided having a photoresist layer 11 formed thereon, as shown in FIG. 2A. Herein, the substrate 10 is a silicon substrate, and the photoresist layer 11 is a negative photoresist layer.

Figure 2B:
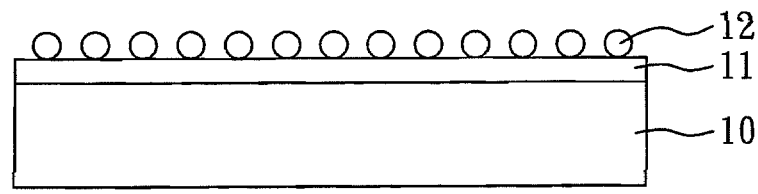

Subsequently, plural nano- or micro-particles 12 are coated on the surface of the photoresist layer 11 to form a nano- or micro-particles layer as shown in FIG. 2B. Herein, the nano- or micro-particles 12 are made of silica and have the same diameter of about 500 nm.

Figure 2C:
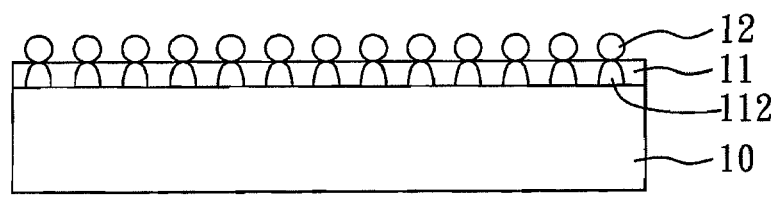

Then, exposing and developing steps are applied to pattern the photoresist layer 11, as shown in FIG. 2C. Since the photoresist layer 11 used herein is negative photoresist, plural rods 112 are formed, and the location of each rod 112 corresponds to the location of the respective nano- or micro-particle 12

Figure 2D:
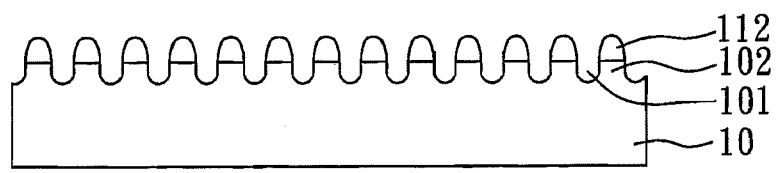

After removing the plural nano- or micro-particles 12, a substrate 10 having a patterned photoresist layer 11 formed thereon is obtained, as shown in FIG. 2D.

Then, the patterned photoresist layer 11 is used as an etching template and the substrate 10 is etched with the dry or wet etching method. By the etching method, the pattern of the patterned photoresist layer 11 (i.e. the rods 112) can be transferred (i.e. copied) to the substrate 10, hence plural rods 112 and rods 102 are together formed on the substrate 10 and the location of each rod 102 corresponds to the respective rod 112, as shown in FIG. 2D.

Figure 2E:
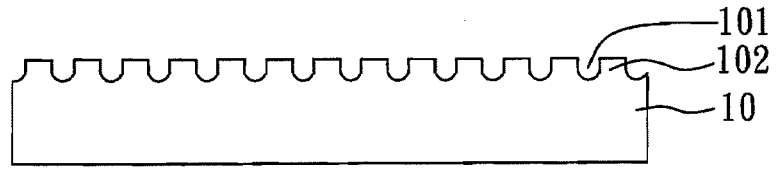

After removing the photoresist layer 11, a patterned substrate 10 is obtained, in which plural cavities 101 and rods 102 are formed therein, as shown in FIG. 2E.

Consequently, the patterned substrate with a nano- or micro-level rugged structure of the present example is provided, which comprises: a substrate 10; and a rugged structure locating on the surface of the substrate 10, wherein the rugged structure has plural cavities 101 and rods 102, as shown in FIG. 2E.

Example 4

Reference with FIGS. 3A to 3F, a schematic process flow chart for manufacturing a patterned substrate by using nano- or micro-particles of the present example is shown.

Figure 3A:
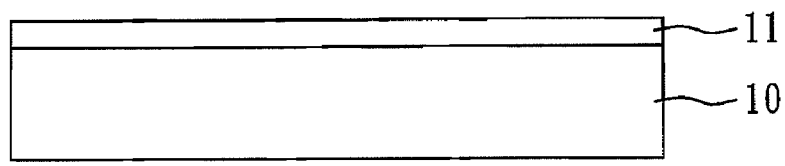
FIGS. 3A to 3F are schematic process flow charts for manufacturing a patterned substrate by using nano- or micro-particles of the example 4 of the present invention.

First, a substrate 10 is provided having a photoresist layer 11 formed thereon, as shown in FIG. 3A. Herein, the substrate 10 is a sapphire substrate, and the photoresist layer 11 is a positive photoresist layer.

Figure 3B:
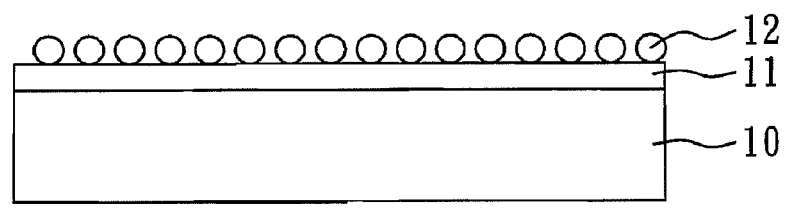

Subsequently, plural nano- or micro-particles 12 are coated on the surface of the photoresist layer 11 to form a nano- or micro-particles layer as shown in FIG. 3B. Herein, the nano- or micro-particles 12 are made of silica and have the same diameter of about 90 nm.

Figure 3C:
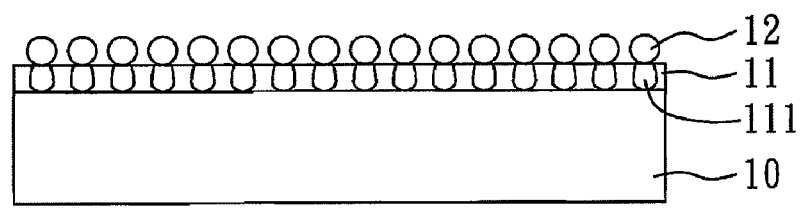

Then, exposing and developing steps are applied to pattern the photoresist layer 11, as shown in FIG. 3C, in which the location of each hole 111 corresponds to the location of the respective nano- or micro-particles 12.

Figure 3D:
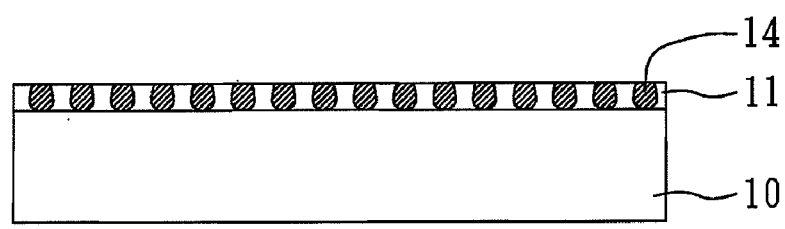

After removing the plural nano- or micro-particles 12, a metal layer 14 is formed on the photoresist layer 11, as shown in FIG. 3D, in which each hole 111 of the photoresist layer 11 is filled with the metal layer 14. Herein, the metal layer 14 is made of nickel. Then the photoresist layer is removed. Finally, there are plural metal rods 14 on the substrate 10.

Figure 3E:
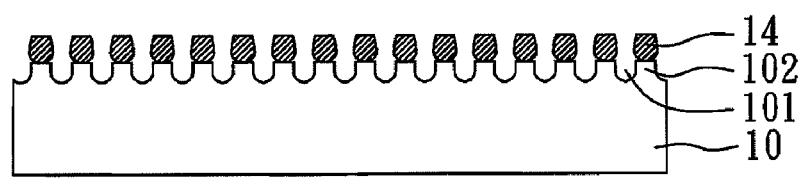

Then, the metal layer 14 is used as an etching template and the substrate 10 is etched with the dry-etching method, as shown in FIG. 3E. By the etching method, the pattern of the metal layers can be transferred (i.e. copied) to the substrate 10, hence plural rods 102 are formed on the substrate 10 and the location of each rods 102 corresponds to the respective hole 111 of the photoresist layer 11, as shown in FIG. 3D.

Figure 3F:

After the metal layer 14 is removed, a patterned substrate 10 is obtained, in which plural rods 102 and cavities 101 are formed therein, as shown in FIG. 3F.

As mentioned above, the present invention utilizes nano- or micro-particles for replacing the prior art photomask during the exposing and developing process. Since those expensive photomasks used in the prior arts are eliminated in the method of present invention, the manufacturing cost can be lowered. Particularly, when a patterned substrate with nano- or micro-fine structures is determined to be made by a patterning method using photomask, a photomask having nano- or micro-fine structures with extremely high cost should be prepared, and therefore the manufacturing cost cannot be lowered. In contrast, the nano- or micro-particles used in the present invention are inexpensive and easily obtained, and the sizes of the nano- or micro-particles can be easily controlled by adjusting the reaction condition during the fabrication of the nano- or micro-particles. Therefore, the method of preparing a patterned substrate of the present invention has the advantages of simplicity in manufacture, low manufacturing cost, and high industrial application efficiency.

Although the present invention has been explained in relation to its preferred embodiment, it is to be understood that many other possible modifications and variations can be made without departing from the scope of the invention as hereinafter claimed.

What is claimed is:

1. A method for preparing patterned substrate by using nano- or micro-particles, which comprises the following steps:
   (A) providing a substrate with a photoresist layer formed thereon;
   (B) coating on the surface of the photoresist layer with plural nano- or micro-particles, to form a particle layer;
   (C) exposing and developing the photoresist layer to obtain a patterned photoresist layer;
   (D) removing the particle layer;
   (E1) using the patterned photoresist layer as an etching template to etch the substrate;
   (E2) removing the patterned photoresist layer to obtain a patterned substrate with plural cavities formed thereon; and
   (E3): filling each of the plural cavities with a nano- or micro-particle.

2. The method for preparing patterned substrate as claimed in claim 1, wherein in the step (E1), the substrate is etched by a dry etching method or a wet etching method.

3. A method for preparing patterned substrate by using nano- or micro-particles, which comprises the following steps:

(A) providing a substrate with a photoresist layer formed thereon;
(B) coating on the surface of the photoresist layer with plural nano- or micro-particles, to form a particle layer;
(C) exposing and developing the photoresist layer to obtain a patterned photoresist layer;
(D) removing the particle layer;
(F1) forming a metal layer on the patterned photoresist layer;
(F2) removing the patterned photoresist layer;
(F3) using the metal layer as an etching template and etching the substrate; and
(F4) removing the metal layer to obtain a patterned substrate having plural rods.

4. The method for preparing patterned substrate as claimed in claim 3, wherein in the step (F3), the substrate is etched by a dry etching method or a wet etching method.

5. The method for preparing patterned substrate as claimed in claim 1, wherein the photoresist layer is a positive photoresist.

6. The method for preparing patterned substrate as claimed in claim 5, wherein in the step (C), the photoresist layer has plural holes.

7. The method for preparing patterned substrate as claimed in claim 1, wherein the photoresist layer is a negative photoresist.

8. The method for preparing patterned substrate as claimed in claim 7, wherein in the step (C), the patterned photoresist layer has plural rods.

9. The method for preparing patterned substrate as claimed in claim 1, wherein in the step (B), the plural nano- or micro-particles are coated on the surface of the photoresist layer by a dip coating method, a spin coating method, a spray coating method, or a natural drying method.

10. The method for preparing patterned substrate as claimed in claim 1, wherein the substrate is made of silicon, aluminum and compounds thereof, gallium and compounds thereof, glass, transparent conductive glass, plastics, metal, metal oxides, metal compounds, or sapphire.

11. The method for preparing patterned substrate as claimed in claim 1, wherein the plural nano- or micro-particles are made of material selected from the group consisted of: styrene, styrene derivatives, acrylic acid, acrylic acid derivatives, maleic acid, maleic acid derivatives, and the combination thereof.

12. The method for preparing patterned substrate as claimed in claim 1, wherein the plural nano- or micro-particles are made of material selected from the group consisted of: carbon-silicon, carbon-titanium, carbon-zirconium, carbon-aluminum, and the combination thereof.

13. The method for preparing patterned substrate as claimed in claim 1, wherein the plural nano- or micro-particles are made of material selected from the group consisted of: nitrogen, silicon, titanium, zirconium, gold, silver, iron, aluminum, copper, nickel, and the combination thereof.

14. The method for preparing patterned substrate as claimed in claim 1, wherein the plural nano- or micro-particles are made of material selected from the group consisted of: silica, polystyrene, poly(methylmethacrylate) (PMMA), and the combination thereof.

15. The method for preparing patterned substrate as claimed in claim 3, wherein the metal layer is made of: silicon, titanium, platinum, zirconium, gold, silver, iron, aluminum, copper, nickel, and the combination thereof.

16. The method for preparing patterned substrate as claimed in claim 1, wherein the particle diameters of the plural nano- or micro-particles are the same with or different from each other.

17. The method for preparing patterned substrate as claimed in claim 1, wherein the particle diameters of the plural nano- or micro-particles are the same with each other.

18. The method for preparing patterned substrate as claimed in claim 1, wherein the particle diameters of the plural nano- or micro-particles are ranged from 90nm to 5mm.

19. The method for preparing patterned substrate as claimed in claim 3, wherein the photoresist layer is a positive photoresist.

20. The method for preparing patterned substrate as claimed in claim 19, wherein in the step (C), the photoresist layer has plural holes.

21. The method for preparing patterned substrate as claimed in claim 3, wherein the photoresist layer is a negative photoresist.

22. The method for preparing patterned substrate as claimed in claim 21, wherein in the step (C), the patterned photoresist layer has plural rods.

23. The method for preparing patterned substrate as claimed in claim 3, wherein in the step (B), the plural nano- or micro-particles are coated on the surface of the photoresist layer by a dip coating method, a spin coating method, a spray coating method, or a natural drying method.

24. The method for preparing patterned substrate as claimed in claim 3, wherein the substrate is made of silicon, aluminum and compounds thereof, gallium and compounds thereof, glass, transparent conductive glass, plastics, metal, metal oxides, metal compounds, or sapphire.

25. The method for preparing patterned substrate as claimed in claim 3, wherein the plural nano- or micro-particles are made of material selected from the group consisted of: styrene, styrene derivatives, acrylic acid, acrylic acid derivatives, maleic acid, maleic acid derivatives, and the combination thereof.

26. The method for preparing patterned substrate as claimed in claim 3, wherein the plural nano- or micro-particles are made of material selected from the group consisted of: carbon-silicon, carbon-titanium, carbon-zirconium, carbon-aluminum, and the combination thereof.

27. The method for preparing patterned substrate as claimed in claim 3, wherein the plural nano- or micro-particles are made of material selected from the group consisted of: nitrogen, silicon, titanium, zirconium, gold, silver, iron, aluminum, copper, nickel, and the combination thereof.

28. The method for preparing patterned substrate as claimed in claim 3, wherein the plural nano- or micro-particles are made of material selected from the group consisted of: silica, polystyrene, poly(methylmethacrylate) (PMMA), and the combination thereof.

29. The method for preparing patterned substrate as claimed in claim 3, wherein the particle diameters of the plural nano- or micro-particles are the same with or different from each other.

30. The method for preparing patterned substrate as claimed in claim 3, wherein the particle diameters of the plural nano- or micro-particles are the same with each other.

31. The method for preparing patterned substrate as claimed in claim 3, wherein the particle diameters of the plural nano- or micro-particles are ranged from 90nm to 5mm.

* * * * *